United States Patent
Larsson et al.

[11] Patent Number: 6,140,199
[45] Date of Patent: Oct. 31, 2000

[54] METHOD AND ARRANGEMENT OF A BURIED CAPACITOR, AND A BURIED CAPACITOR ARRANGED ACCORDING TO SAID METHOD

[75] Inventors: Torbjorn Larsson, Uppsala; Jonas Jonsson, Sundbyberg, both of Sweden

[73] Assignee: Telefonaktiebolaget IM Ericsson, Stockholm, Sweden

[21] Appl. No.: 09/090,218

[22] Filed: Jun. 4, 1998

[30] Foreign Application Priority Data

Jun. 6, 1997 [SE] Sweden .................................. 9702182

[51] Int. Cl.[7] ..................................................... H01L 21/20
[52] U.S. Cl. ........................... 438/387; 438/386; 438/391; 438/243
[58] Field of Search ..................................... 438/243, 387, 438/386, 391, 397; 257/301

[56] References Cited

U.S. PATENT DOCUMENTS

| | | | |
|---|---|---|---|
| 4,656,054 | 4/1987 | Inoue | 427/81 |
| 4,990,463 | 2/1991 | Mori | 438/386 |
| 5,013,680 | 5/1991 | Lowrey et al. | |
| 5,034,341 | 7/1991 | Itoh | 438/242 |
| 5,213,999 | 5/1993 | Sparks et al. | 438/639 |
| 5,466,628 | 11/1995 | Lee et al. | |
| 5,708,559 | 1/1998 | Brabazon et al. | 361/313 |
| 5,937,296 | 8/1999 | Arnold | 438/270 |

FOREIGN PATENT DOCUMENTS 90 11619  10/1990  WIPO .

*Primary Examiner*—Donald L. Monin, Jr.
*Assistant Examiner*—Ginette Peralta

[57] ABSTRACT

The present invention relates to a method for arrangement of a buried capacitor on a substrate or the like, and a buried capacitor arranged according to the method. In order to diminish the resistive losses in a capacitor and to make it more efficient, in semi-conductor circuits, instead of the polycrystalline layer, one or more bodies of metal such as aluminum or tungsten may be used. This has been made possible using a new technique in which a trench filling of conducting material is etched away without removal through etching of the insulating layer in the trench. After the removal through etching of the trench filling, the trench is filled using the metal as above, whereby the insulating layer between the conducting material and the metal body will separate two conducting surfaces, thereby forming the buried capacitor.

11 Claims, 6 Drawing Sheets

METHOD AND ARRANGEMENT OF A BURIED CAPACITOR, AND A BURIED CAPACITOR ARRANGED ACCORDING TO SAID METHOD

FIELD OF THE INVENTION

The present invention concerns a method of arranging a buried capacitor on a substrate or the like, and a buried capacitor arranged according to said method.

BACKGROUND OF THE INVENTION

In order to arrange for a capacitance function or a capacitor on a substrate in the manufacture of integrated circuits, an insulating layer has been used between e.g. a layer of polycrystalline silicon and a layer of monocrystalline silicon, whereat a groove or the like insulates the capacitor formed from the surrounding region. In FIG. 1 is shown a cross section of a construction of a capacitor according to the above, in which an insulating layer 1 is situated between a polycrystalline silicon layer 2B and a monocrystalline silicon layer 3. A first metal conductor 4 is connected to a first metal plug 5, which is connected to a layer of polycrystalline silicon 2A on the monocrystalline silicon layer 3. A second metal conductor 6 is connected to a second metal plug 7, which is connected to the polycrystalline silicon layer 2B. Between the polycrystalline silicon layer 2B and the underlying monocrystalline silicon layer 3 the insulating layer 1 is situated, whereat the region delimited by the polycrystalline silicon layer 2B, the insulating layer 1 and the underlying part of the monocrystalline silicon layer 3 constitutes the capacitor, per se, which is connectable via the metal conductors 4 and 6.

Such a capacitor construction is easily manufactured using modern technique. In order to separate the capacitor construction from the other parts on the substrate, the substrate has been provided with grooves/trenches 8 having insulating wall material 9 filled with suitable filling. The polycrystalline layer in the capacitor, however, contributes to the resistive losses in the capacitor. The resistive losses make the capacitor less effective in decoupling of disturbances, generates more thermal noise, which may be a limiting factor in a radio construction. A filter construction in which a capacitor of the above described type is a part may cause high losses in the filter, e.g. make the filter less efficient.

In e.g. U.S. Pat. No. 5,013,680, U.S. Pat. No. 5,466,628 and WO-A 90 11 619 arrangements of capacitor functions/capacitors on substrates are shown.

SUMMARY OF THE INVENTION

In semiconductor circuits, in order to reduce the resistive losses in a capacitor and to make it more efficient, one or more metal bodies such as bodies of aluminum or tungsten may be used, which metals show a lower resistivity than the polycrystalline layer. This has been made possible using a new technique, in which the trench filling is etched away without etching away the insulating layer in the trench. When the trench filling has been etched away the trench is filled with a metal according to above, whereat plug metal may be used as filling and a so-called buried capacitor is thereby obtained. The metal plug may be directly coupled to a metal conductor, which in conjunction with the low resistivity in the fill metal decreases the resistive losses in the capacitor and makes it more effective. Knowing that one buried capacitor may be arranged, several capacitors may be arranged together and interacting on the same substrate, whereat, in dependence of the pattern build-up of the capacitors and the degree of coupling of these, a capacitor function having a predetermined capacitance may be achieved.

The invention will now be further described with reference to the attached drawings.

DETAILED DESCRIPTION OF PREFERRED EMBODIMENTS OF THE INVENTION

Figure 1:
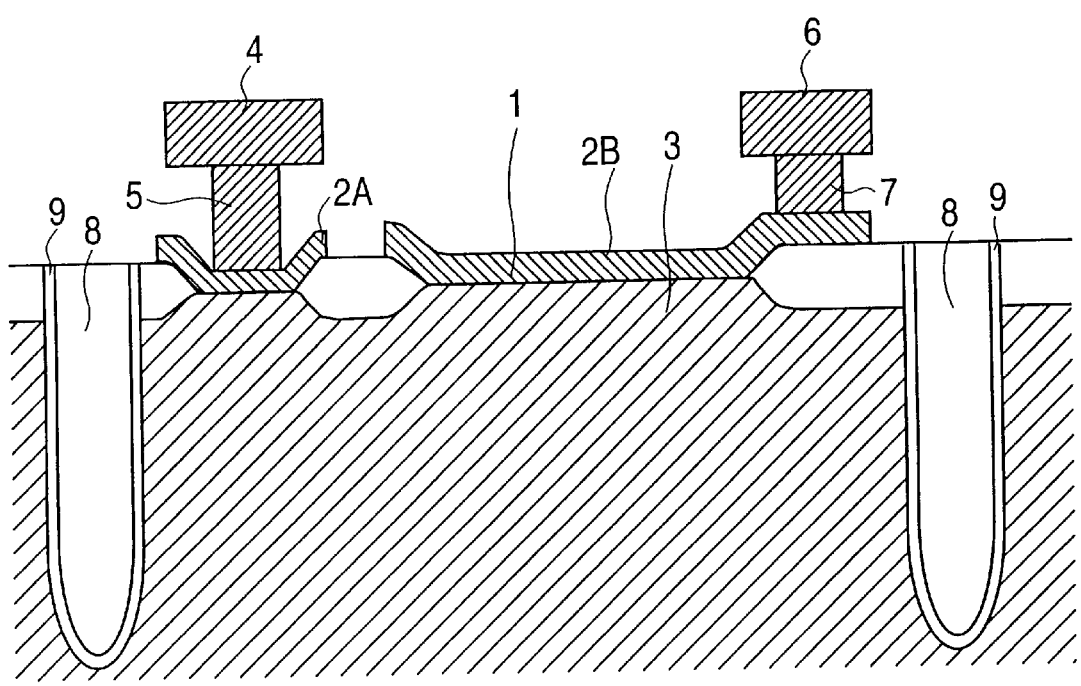
FIG. 1 is a cross section of a known construction of a capacitor.
Figure 2:
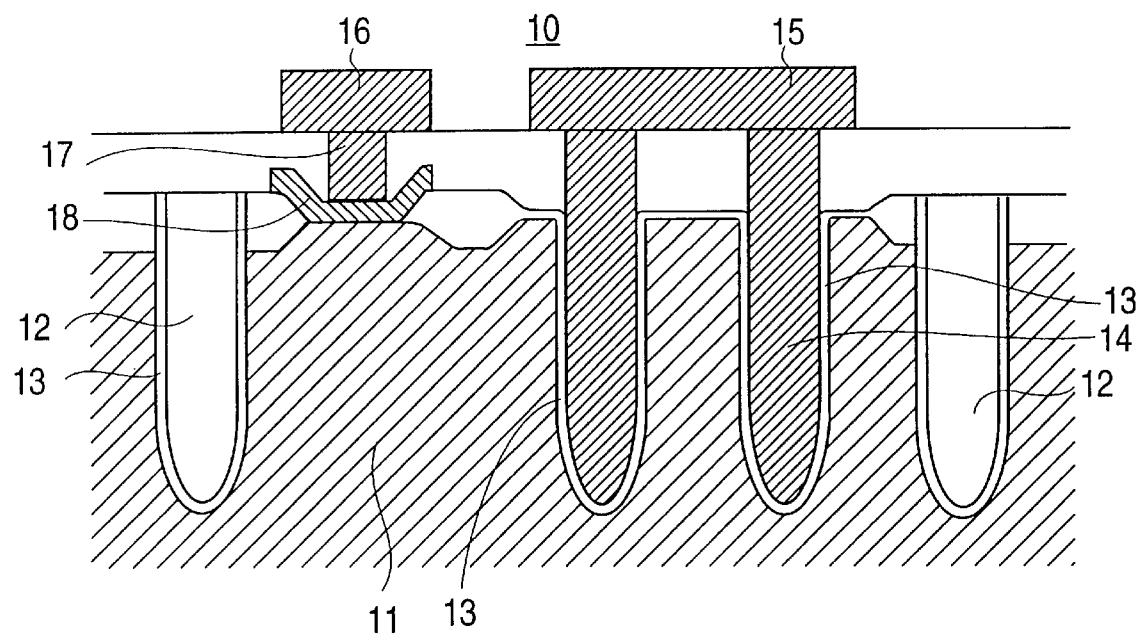
FIG. 2 is a cross section of a capacitor according to the invention.

In FIG. 2, a cross section of the build-up of a capacitor 10 according to the invention is shown. In a layer 11 of monocrystalline silicon in a substrate and a component carrier, grooves 12 and/or holes have been etched, which have been provided with a layer 13 of insulating material. Depending on the build-up of the capacitor, one or more grooves/trenches or holes or a pattern of holes have been filled with metal 14, such as aluminum or tungsten, a so-called plug metal, which has been connected with an upper conductor metal 15 in order to constitute one side of the contact surface of the capacitor 10. The second surface of the capacitor constitutes a short metal plug 17 connected to an upper conductor metal 16 connected to a polycrystalline silicon layer 18 connected to the layer 11 comprising monocrystalline silicon, whereat the insulating layer 13, situated between the monocrystalline silicon layer 11 and the trench metal 14, separates two conducting surfaces, thus forming a buried capacitor.

Figure 3A:
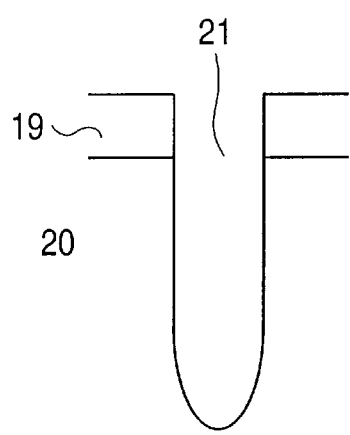
FIGS. 3a–c are cross sections of steps in the manufacture of the capacitor in FIG. 2.
Figure 3B:
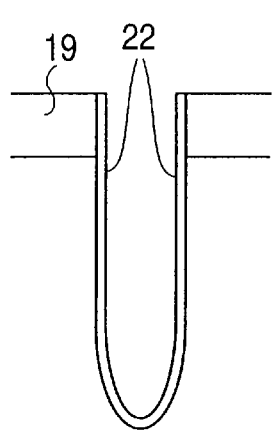
Figure 3C:
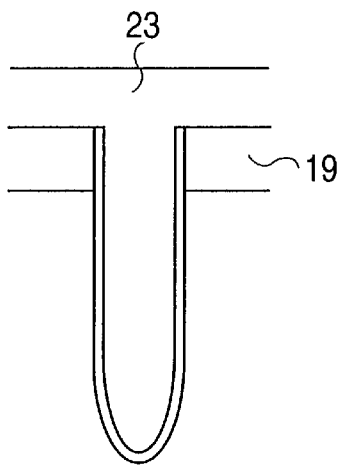

In FIGS. 3a–c, a method of manufacturing a buried capacitor is shown in cross-section. In a substrate comprising a upper insulating layer 19 and an underlying conducting layer 20 of polycrystalline silicon, one or more holes 21 or one or more grooves/trenches have been etched, see FIG. 3a. The holes have thereafter been provided with an insulating layer 22 in order to insulate the filling placed in the holes, see FIG. 3b. In FIG. 3c is shown that the hole/trench has been filled with a suitable metal 23, which metal also may cover a part of the region above the insulating layer in order to form a first contact surface of the buried capacitor. The second contact surface may be formed according to FIG. 2.

Figure 4A:
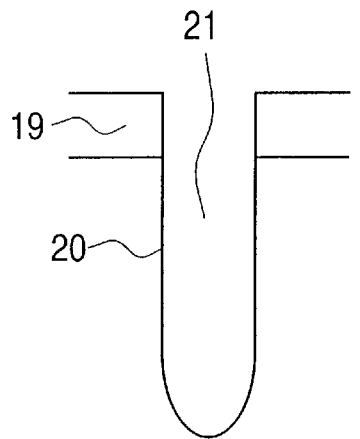
FIGS. 4a–h are cross sections of alternative steps in the manufacture of the capacitor in FIG. 2.
Figure 4B:
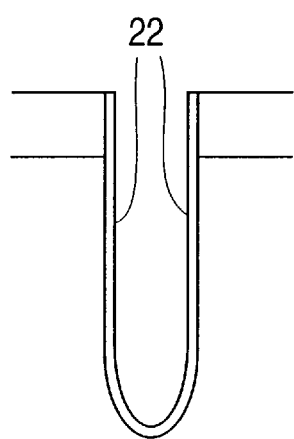
Figure 4C:
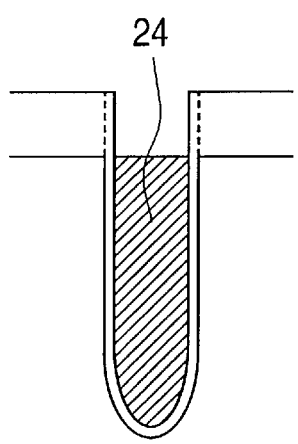
Figure 4D:
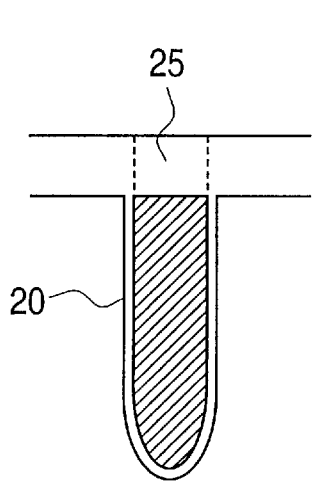
Figure 4E:
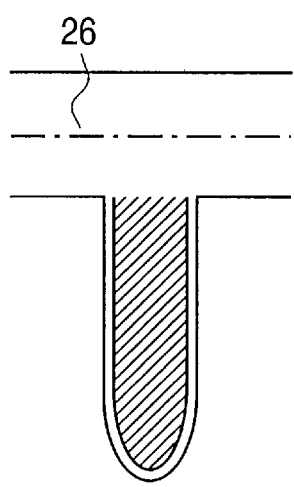
Figure 4F:
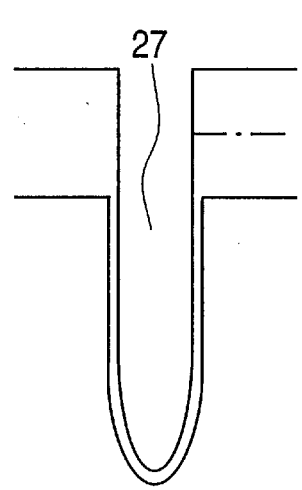
Figure 4G:
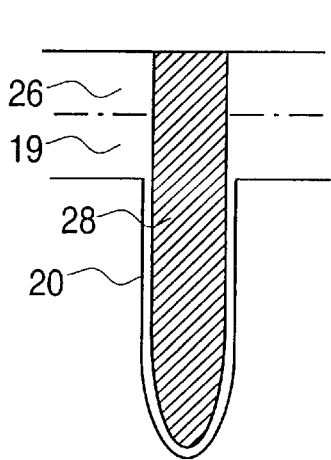
Figure 4H:
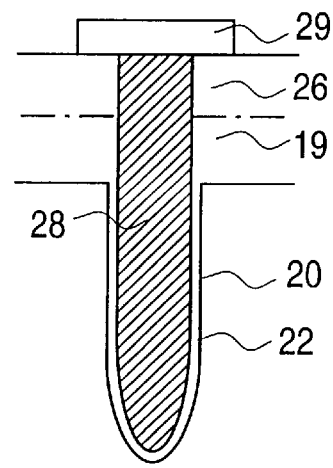

In FIGS. 4a–h, an alternative method of manufacturing a buried capacitor is shown in cross-section. This method has the advantage of the high temperature processes being performed before the low temperature processes in the manufacture of buried capacitors. In a substrate comprising an upper insulating layer 19 and a lower conducting layer 20 of monocrystalline silicon, one or more holes 21 or grooves/trenches have been etched, see FIG. 4a. The hole has thereafter been provided with an insulating layer 22 for insulation of a filling placed in the hole, see FIG. 4b. In FIG. 4c the hole in the substrate has been filled using an insulator suitable for the purpose, e.g. polycrystalline silicon 24. In FIG. 4d an insulated trench cover 25 is shown placed in the hole in the insulating layer above the trench filling. Hereafter, other components in the circuit may be formed. In FIG. 4e is shown that a further insulating layer 26 has been placed over the prior arranged insulating layer, as a step in a subsequent metallisation step. In FIG. 4f is shown that a hole 27 or a trench has been etched down through the insulating layers 19, 26 and down into the trench filling for removal of the same, whereat the insulated hole remains. In FIG. 4g is shown that the hole 27 or the trench has been filled with a metal plug 28, such as aluminum or tungsten, in order to achieve a buried insulated metal body in the substrate. In FIG. 4h is shown that a conducting layer 29 has been added onto the upper insulating layer in contact with the metal plug for forming of a first buried capacitor contact surface, whereat the second contact surface may be formed as in FIG. 2, whereby a buried capacitor exhibiting good performance characteristics has been achieved on the substrate.

Figure 5A:
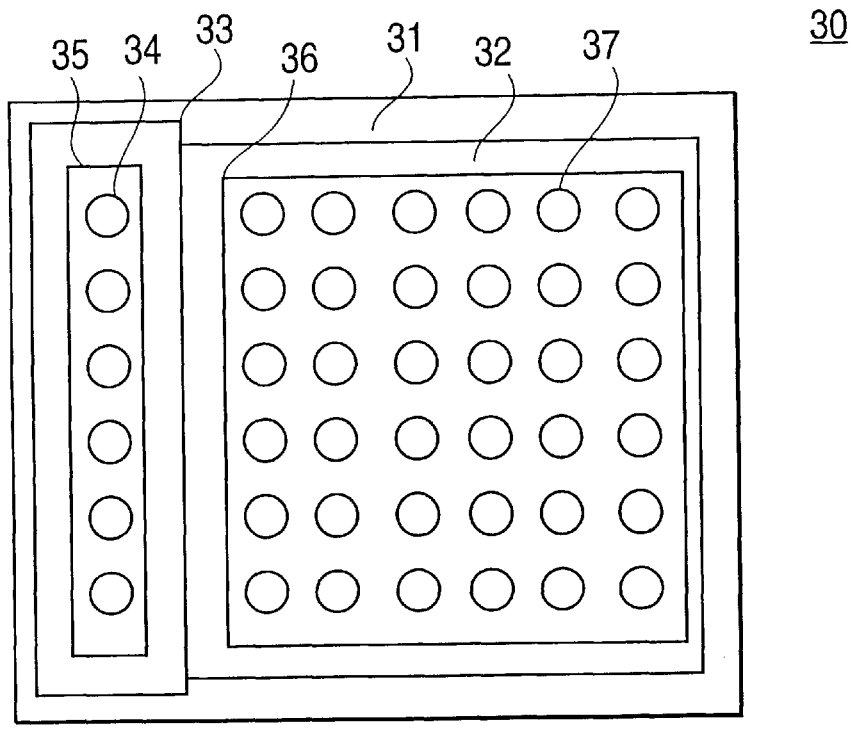
FIGS. 5a and b are views from above of a composite capacitor according to the invention.
Figure 5B:
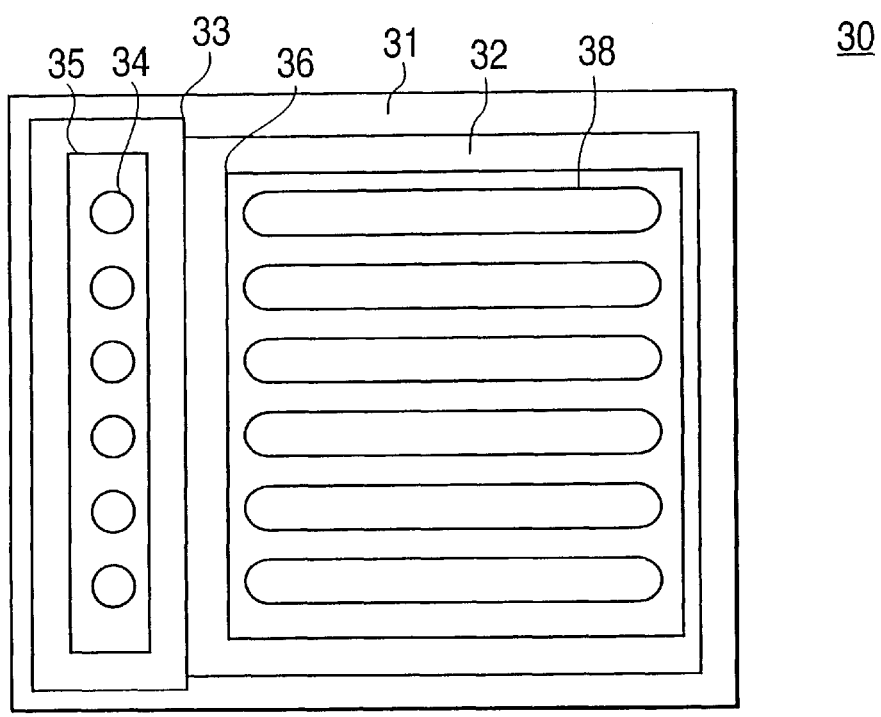

In FIGS. 5a and b, the build-up of a composite capacitor 30 is shown from above, consisting of several assembled and buried capacitors. The capacitor in FIG. 5a is delimited outwardly by an insulated groove 31 in a layer 32 of monocrystalline silicon on a substrate. The first contact surface on the composite capacitor is a metal conductor 33 connected to the metal plugs 34 connected to a polycrystalline silicon layer 35 connected to a layer 32 of monocrystalline silicon on the substrate. The second contact surface on the composite capacitor is an upper layer 36 which is insulated against the environment and connected to the metal plugs/fillings 37 made of e.g. aluminum or tungsten in insulated holes in the monocrystalline silicon layer 32. In FIG. 5b, insulated grooves 38 filled with suitable metal as aluminum and tungsten in contact with the upper conducting surface layer 36, insulated against the environment, have been arranged instead of several holes having metal plugs. Depending on the number of holes and/or the length of the grooves, the effective conducting surfaces, separated by insulation, can be varied and, thus, the capacitance of the capacitor can be varied.

Figure 6A:
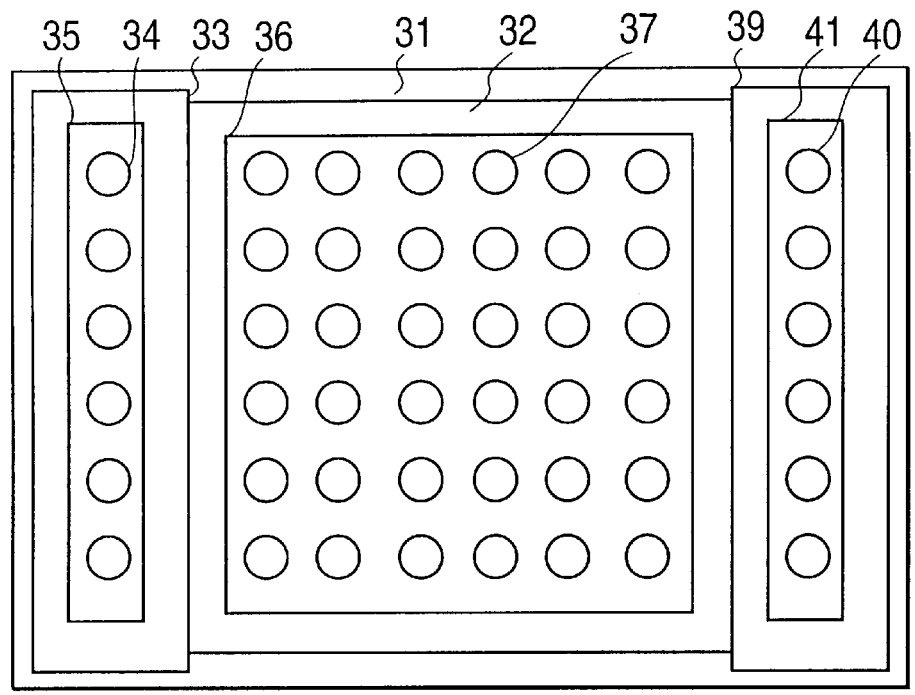
FIGS. 6a and b are views from above of an alternative composite capacitor according to the invention.
Figure 6B:
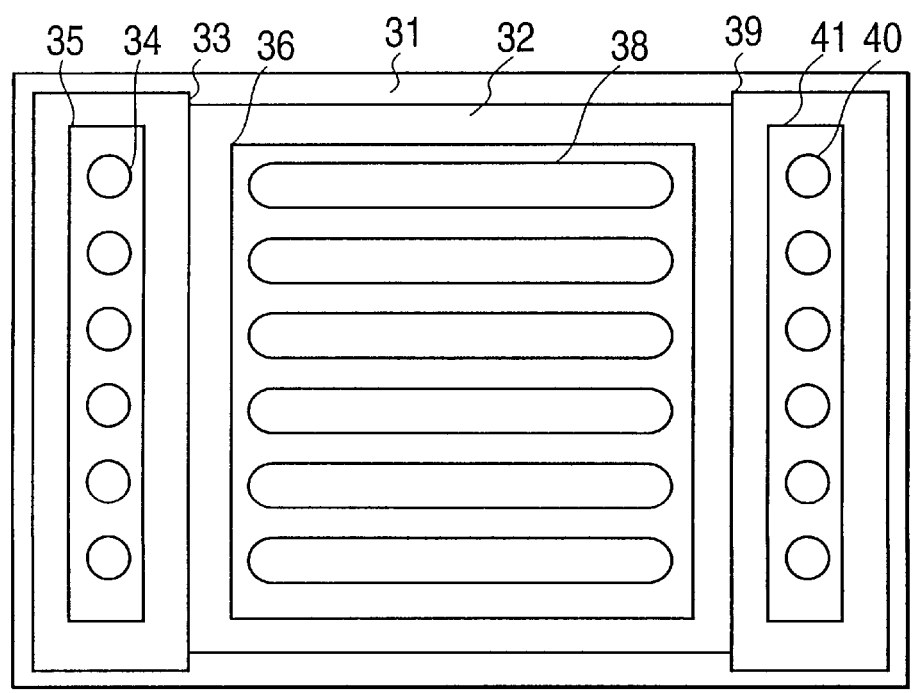

In FIG. 6a, the build-up of an alternative composite capacitor is shown from above, which capacitor consists of several combined and buried capacitors. In this embodiment the first contact surface consists of two metallic conductors 33,39 connected to metal plugs 34,40, which are connected to a polycrystalline silicon layer 35,41 connected to the layer 32 of monocrystalline silicon on a substrate. The second contact surface essentially corresponds to the second contact surface described in FIG. 5. Also in this build-up, insulated grooves 38 in the monocrystalline silicon layer 32 filled with suit-able metal may be used in order to form two separated conducting surfaces, as shown in FIG. 6b.

Figure 7A:
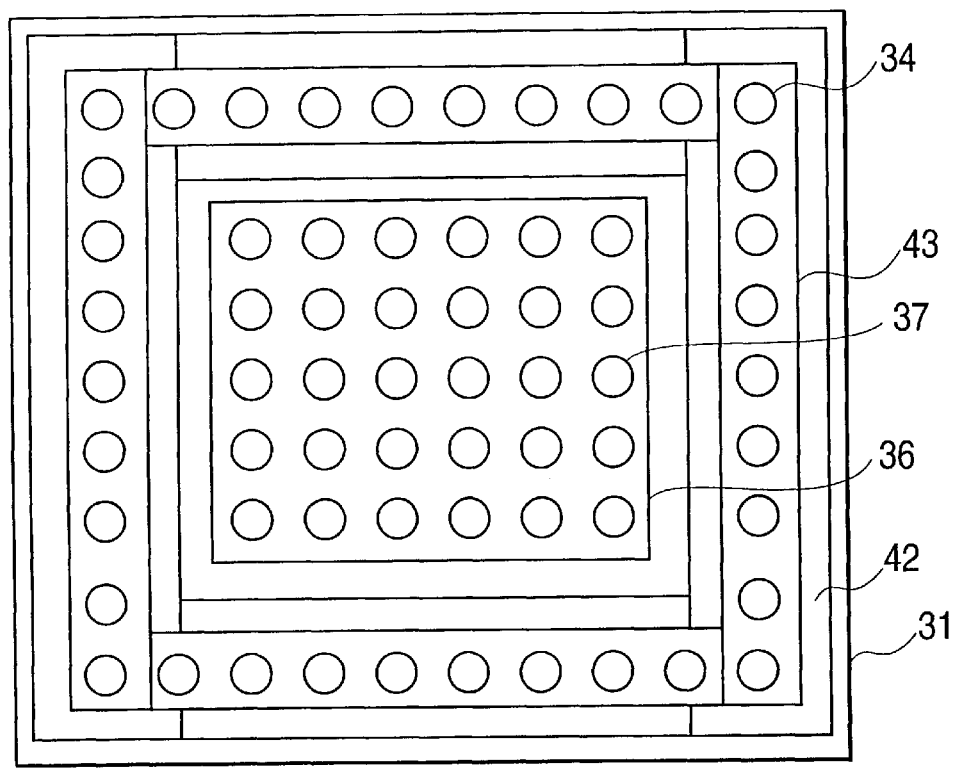
FIGS. 7a and b are views from above of a further embodiment of a composite capacitor according to the invention.
Figure 7B:
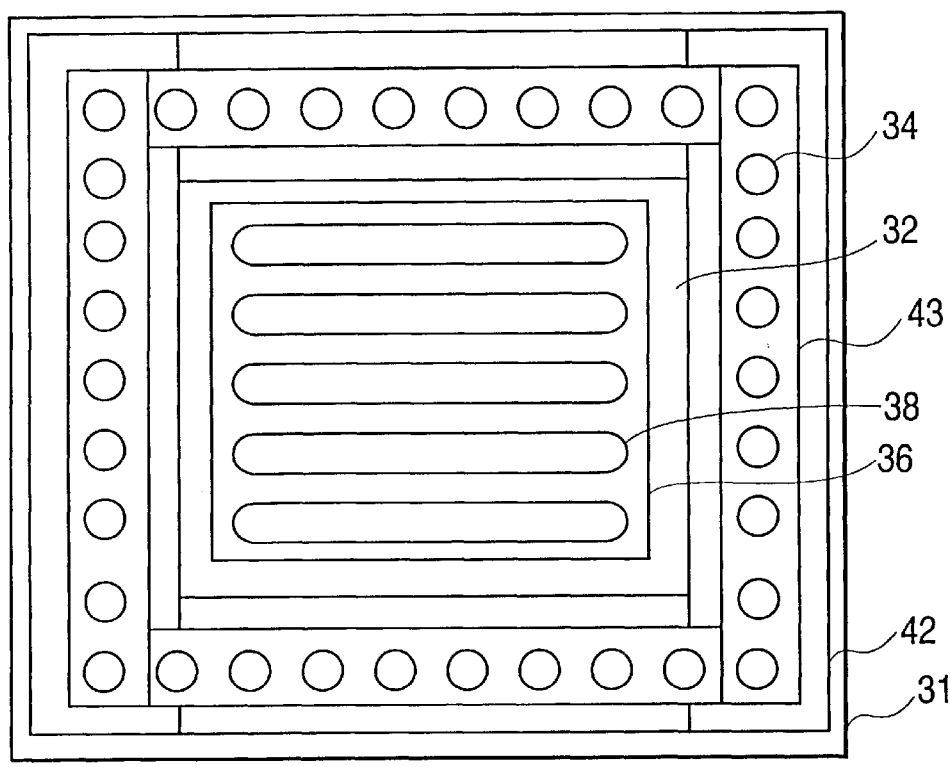

In FIGS. 7a and b, the build-up of a further embodiment is shown from above, in which a surrounding and closed outer contact surface constitutes the first contact surface, in which embodiment the contact surface is a circumventing metallic conductor 42 connected to metal plugs 34 connected to a circumventing polycrystalline silicon layer 43. The second contact surface essentially corresponds to the second contact surface described in FIG. 5. In this capacitor also, build-up insulated grooves 38 in the monocrystalline silicon layer 32 filled with suitable metal may be used, as is shown in FIG. 7b.

The invention is naturally not limited to the above described embodiments and to the embodiments shown in the Figures, but may be modified within the scope of the attached claims.

What is claimed is:

1. A method for arrangement of a buried capacitor on a semiconductor substrate, comprising the steps of:
   a) forming at least one hole or groove in said semiconductor substrate;
   b) supplying the at least one hole or groove formed in said step a) with a first insulating layer coating the surface thereof to form an insulated hole or groove;
   c) filling said at least one hole or groove with a filler material;
   d) covering the hole or groove filled in said step b) with a second insulating layer,
   e) completing high temperature processes to said substrate subsequent to completion of steps a)–d);
   f) accessing said at least one hole or groove by removing the second insulating layer added in said step d) and said filler material in said step c); and,
   g) subsequent to steps a)–e), filling the insulated hole or groove with a metal.

2. The method of claim 1 wherein said semiconductor substrate forms a first capacitor electrode,
   said metal used to fill said insulated hole or groove in said step g) forming a second capacitor electrode;
   said first insulating layer forming a capacitor dielectric between said first and second capacitor electrodes.

3. The method of claim 1 wherein said step g) is performed after all high temperature processes are performed to said substrate.

4. The method of claim 1 wherein said metal used in said step g) is aluminum.

5. The method of claim 1 wherein said metal used in said step g) is tungsten.

6. The method of claim 1 wherein step a) etches plural holes or grooves;
   said step b) supplyies the first insulating layer to each of said holes or grooves etched in said step a);
   said step g) filling each of said holes or grooves to form plural metal bodies having a depth dimension substantially greater than at least one of the width or length dimensions extending along the surface of said substrate.

7. The method of claim 6 further comprising g) connecting together said plural, metal bodies to form one side of said buried capacitor.

8. The method of claim 7, wherein said step g) supplies a first conductor to connect the plural metal bodies to form a first contact to the capacitor;
   said method further comprising supplying a second conductor to connect to the conducting material of said substrate to form a second contact surface of the capacitor.

9. The method of claim 1 wherein said hole or groove etched said step a) is substantially deeper than its width to thereby form a capacitor primarily extending generally vertically.

10. The method of claim 1 wherein said filler material is a polycrystalline silicon.

11. The method of claim 1 wherein said semiconductor substrate is formed of monocrystalline silicon.

* * * * *